(12) United States Patent
Ishibe et al.

(10) Patent No.: US 9,608,212 B2
(45) Date of Patent: Mar. 28, 2017

(54) ORGANIC PHOTOELECTRIC DEVICES, IMAGE SENSORS, AND ELECTRONIC DEVICES

(71) Applicant: Samsung Electronics Co., Ltd., Suwon-si, Gyeonggi-do (KR)

(72) Inventors: Satoko Ishibe, Seongnam-si (KR); Moon Gyu Han, Suwon-si (KR); Dong-Seok Leem, Hwaseong-si (KR); Kwang Hee Lee, Yongin-si (KR); Yong Wan Jin, Seoul (KR); Yeong Suk Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 62 days.

(21) Appl. No.: 14/798,984

(22) Filed: Jul. 14, 2015

(65) Prior Publication Data

US 2016/0225826 A1   Aug. 4, 2016

(30) Foreign Application Priority Data

Feb. 4, 2015   (KR) .................. 10-2015-0017638

(51) Int. Cl.
*H01L 27/30* (2006.01)
*H01L 51/00* (2006.01)
*H01L 51/42* (2006.01)

(52) U.S. Cl.
CPC ........ *H01L 51/008* (2013.01); *H01L 51/0059* (2013.01); *H01L 51/4253* (2013.01)

(58) Field of Classification Search
None
See application file for complete search history.

(56) References Cited

U.S. PATENT DOCUMENTS

| | | | |
|---|---|---|---|
| 2010/0065112 | A1 | 3/2010 | Thompson et al. |
| 2010/0084011 | A1 | 4/2010 | Forrest et al. |
| 2012/0248419 | A1 | 10/2012 | Thompson et al. |
| 2016/0225826 | A1* | 8/2016 | Ishibe .................. H01L 27/307 |

FOREIGN PATENT DOCUMENTS

| | | |
|---|---|---|
| WO | WO-2010031042 A1 | 3/2010 |
| WO | WO-2010036963 A1 | 4/2010 |
| WO | WO-2014015288 A1 | 1/2014 |

OTHER PUBLICATIONS

Paul Sullivan, "Halogenated Boron Subphthalocyanines as Light Harvesting Electron Acceptors in Organic Photovoltaics", Advanced Energy Materials, 2011, p. 352-355, WILEY-VCH Verlag GmbH & Co. KGaA Weinheim.

(Continued)

*Primary Examiner* — Jack Chen
(74) *Attorney, Agent, or Firm* — Harness, Dickey & Pierce, P.L.C.

(57) ABSTRACT

Organic photoelectric devices, image sensors, and electronic device, include a first electrode and a second electrode facing each other, and an active layer between the first electrode and the second electrode, wherein the active layer includes a p-type semiconductor compound including a squaraine derivative and an n-type semiconductor compound represented by Chemical Formula 1.

18 Claims, 7 Drawing Sheets

(56) References Cited

OTHER PUBLICATIONS

Brian E. Lassiter, "Tandem organic photovoltaics using both solution and vacuum deposited small molecules", Applied Physics Letters, 2012, AIP Publishing.
Nana Wang, "Snow cleaning of substrates increases yield of large-area organic photovoltaics", Applied Physics Letters, 2012, AIP Publishing.
B.E. Lassiter, "Tandem organic photobvoltaics incorporating two solution-processed small molecule donor layers". Applied Physics Letters, 2013, AIP Publishing.
C.C. Mattheus, "Influence of the molecular shape on the film growth of a substituted phthalocyanine", Sythetic Metals, 2004, p. 335-339, Elsevier B.V.
Kevin J. Bergemann, "Measurement of exciton diffusion lengths in optically thin organic films", Applied Physics Letters, 2011, AIP Publishing.
Guodan Wei, "Arylamine-Based Squaraine Donors for Use in Organic Solar Cells", NANO Letters, 2011, p. 4261-4264, American Chemical Society Publications.

* cited by examiner

ORGANIC PHOTOELECTRIC DEVICES, IMAGE SENSORS, AND ELECTRONIC DEVICES

CROSS REFERENCE TO RELATED APPLICATION

This application claims the benefit of priority, under 35 U.S.C. §119, from Korean Patent Application No. 10-2015-0017638 filed in the Korean Intellectual Property Office on Feb. 4, 2015, the entire contents of which are incorporated herein by reference.

BACKGROUND

1. Field

Example embodiments relate to organic photoelectric devices, image sensors, and/or electronic devices.

2. Description of the Related Art

Photoelectric devices convert light into an electrical signal using photoelectric effects. Photoelectric devices may include a photodiode, a phototransistor, and the like. Photoelectric devices may be applied to an image sensor, a solar cell, an organic light-emitting diode, and the like.

An image sensor including a photodiode requires high resolution, and thus a small pixel. At present, a silicon photodiode is widely used, but the silicon photodiode has deteriorated sensitivity due to a small absorption area resulting from small pixels. Accordingly, organic materials capable of replacing silicon are being researched.

Organic materials have a high extinction coefficient, and selectively absorb light in a particular wavelength region depending on their molecular structure, and thus may simultaneously replace a photodiode and a color filter, resulting in improve sensitivity and higher integration.

SUMMARY

Example embodiments relate to organic photoelectric devices, image sensors, and/or electronic devices.

Example embodiments provide an organic photoelectric device that selectively absorbs light in a green wavelength region of about 500 nm to about 600 nm and has improved external quantum efficiency, and thus has improved sensitivity and is capable of realizing high integration.

According to example embodiments, an organic photoelectric device includes a first electrode and a second electrode facing each other, and an active layer interposed between the first electrode and the second electrode, wherein the active layer includes a p-type semiconductor compound including a squaraine derivative and an n-type semiconductor compound represented by Chemical Formula 1.

[Chemical Formula 1]

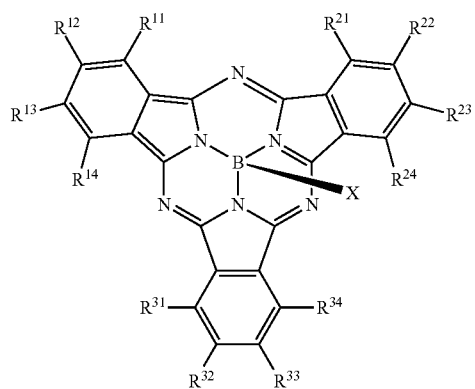

In Chemical Formula 1, $R^{11}$ to $R^{14}$, $R^{21}$ to $R^{24}$, and $R^{31}$ to $R^{34}$ are each independently hydrogen, a substituted or unsubstituted C1 to C30 alkyl group, a substituted or unsubstituted C6 to C30 aryl group, a substituted or unsubstituted C3 to C30 heteroaryl group, a nitro group, a cyano group, a cyano-containing group, $SF_5$, a halogen, or a halogen-containing group, provided that at least one of $R^{11}$ to $R^{14}$, at least one of $R^{21}$ to $R^{24}$, and at least one of $R^{31}$ to $R^{34}$ are a nitro group, a cyano group, a cyano-containing group, $SF_5$, a halogen, a halogen-containing group, or a combination thereof, and X is a halogen, OAr (wherein Ar is a substituted or unsubstituted C6 to C30 aryl group or a substituted or unsubstituted C5 to C20 heteroaryl group), OR (wherein R is a substituted or unsubstituted linear or branched C1 to C30 alkyl group), or $OSiR^1R^2R^3$ (wherein $R^1$, $R^2$, and $R^3$ are each independently a substituted or unsubstituted linear or branched C1 to C30 alkyl group).

In Chemical Formula 1, $R^{12}$, $R^{13}$, $R^{22}$, $R^{23}$, $R^{32}$, and $R^{33}$ are each independently a nitro group, a cyano group, a cyano-containing group, $SF_5$, a halogen, a halogen-containing group, or a combination thereof, and $R^{11}$, $R^{14}$, $R^{21}$, $R^{24}$, $R^{31}$, and $R^{33}$ are independently hydrogen, a C1 to C30 alkyl group, a C6 to C30 aryl group, a C3 to C30 heteroaryl group, or a combination thereof.

The squaraine derivative may be represented by Chemical Formula 2.

[Chemical Formula 2]

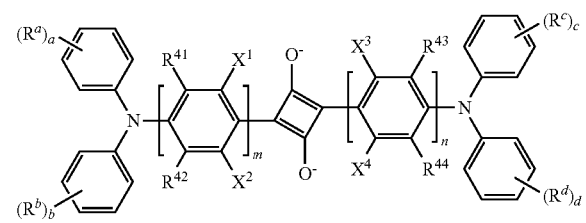

In Chemical Formula 2, $R^{41}$ to $R^{44}$ are each independently hydrogen, a substituted or unsubstituted C1 to C20 alkyl group, a substituted or unsubstituted C6 to C12 aryl group, or a substituted or unsubstituted C3 to C20 heteroaryl group, $X^1$ to $X^4$ are each independently hydrogen, a hydroxy group, a substituted or unsubstituted C1 to C20 alkyl group, a substituted or unsubstituted C6 to C12 aryl group, or a substituted or unsubstituted C3 to C20 heteroaryl group, provided that at least one of $X^1$ and $X^2$ and at least one of $X^3$ and $X^4$ are a hydroxy group, $R^a$ to $R^d$ are each independently hydrogen, a substituted or unsubstituted C1 to C20 alkyl group, a substituted or unsubstituted C6 to C12 aryl group, or a substituted or unsubstituted C3 to C20 heteroaryl group, a to d are each independently an integer of 0 to 5, and m and n are independently an integer of 0 or 1, but are not simultaneously 0 or 1.

The active layer may show a maximum absorption peak in a wavelength region of about 500 nm to about 600 nm.

The active layer may show a light absorption curve depending on a wavelength having a full width at half maximum (FWHM) in a thin film state of about 50 nm to about 100 nm.

The p-type semiconductor compound and the n-type semiconductor compound may each have an energy bandgap of about 1.0 eV to about 3.0 eV.

A lowest unoccupied molecular orbital (LUMO) difference between the p-type semiconductor compound and n-type semiconductor compound may be about 1.0 eV to about 3.0 eV.

The active layer may include the p-type semiconductor compound and the n-type semiconductor compound, and a volume ratio of the p-type semiconductor compound to the n-type semiconductor compound may vary based on locations of the p-type and n-type semiconductor compounds.

The first electrode may be an anode and the second electrode may be a cathode, an amount an amount of the p-type semiconductor compound may increase from the cathode towards the anode, and an amount of the n-type semiconductor compound may increase from the anode towards the cathode.

The p-type semiconductor compound and the n-type semiconductor compound may be included in a volume ratio of about 1:100 to about 100:1.

The organic photoelectric device may further include a p-type layer between the first electrode and the active layer, and the p-type layer may include the p-type semiconductor compound.

The organic photoelectric device may further include an n-type layer between the second electrode and the active layer, and the n-type layer may include the n-type semiconductor compound.

According to example embodiments, an image sensor including the organic photoelectric device is provided.

The image sensor may include a semiconductor substrate integrated with a plurality of first photo-sensing devices sensing light in a blue wavelength region and a plurality of second photo-sensing devices sensing light in a red wavelength region, wherein the organic photoelectric device is on the semiconductor substrate and selectively absorbs light in a green wavelength region.

The first photo-sensing device and the second photo-sensing device may be stacked in a vertical direction on the semiconductor substrate.

The image sensor may further include a color filter layer between the semiconductor substrate and the organic photoelectric device, and the color filter may include a blue filter selectively absorbing light in a blue wavelength region and a red filter selectively absorbing light in a red wavelength region.

The image sensor may further include a stack of photoelectric devices, wherein the stack of photoelectric devices includes a green photoelectric device of the organic photoelectric device, a blue photoelectric device selectively absorbing light in a blue wavelength region, and a red photoelectric device selectively absorbing light in a red wavelength region.

According to example embodiments, an electronic device including the image sensor is provided.

BRIEF DESCRIPTION OF THE DRAWINGS

Example embodiments will be more clearly understood from the following detailed description taken in conjunction with the accompanying drawings.

FIG. 1 is a cross-sectional view of an organic photoelectric device according to example embodiments, FIG. 2 is a cross-sectional view of an organic photoelectric device according to example embodiments, FIG. 3 is a schematic top plan view showing an organic CMOS image sensor according to example embodiments, FIG. 4 is a cross-sectional view showing the organic CMOS image sensor of FIG. 3, FIG. 5 is a schematic cross-sectional view showing an organic CMOS image sensor according to example embodiments, FIG. 6 is a schematic top plan view showing an organic CMOS image sensor according to example embodiments, and FIG. 7 is a cross-sectional view showing the organic CMOS image sensor of FIG. 6.

DETAILED DESCRIPTION

Figure 1:
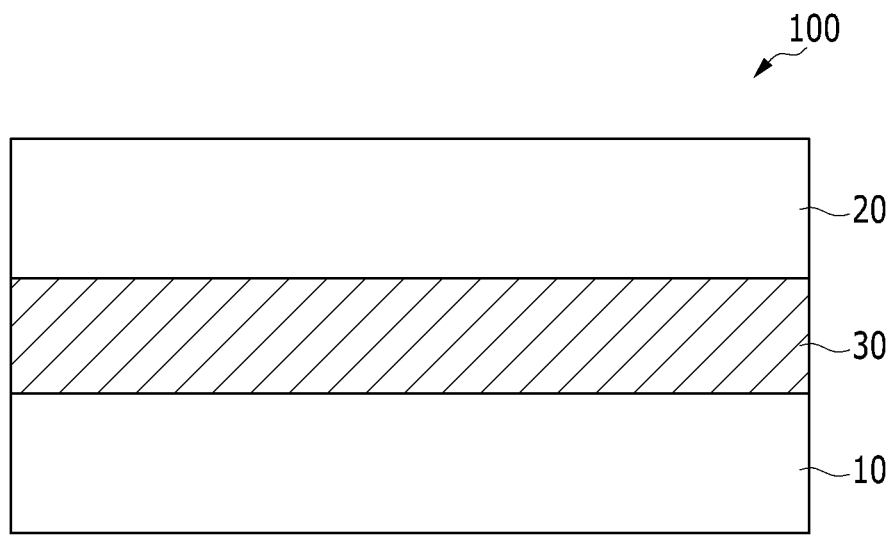
FIGS. 1-7 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, when specific definition is not otherwise provided, the term "substituted" refers to one substituted with a substituent selected from a halogen (F, Br, Cl, or I), a nitro group, a cyano group, an amino group, an azido group, an amidino group, a hydrazino group, a hydrazono group, a carbonyl group, a carbamyl group, a thiol group, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C1 to C20 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when a definition is not otherwise provided, the "halogen" refers to F, Cl, Br, or I, and a halogen-containing group refers to a C1 to C30 alkyl group where at least one hydrogen of a C1 to C30 alkyl group is replaced by F, Cl, Br, or I, or a C6 to C30 haloaryl group where at least one hydrogen of a C6 to C30 aryl group is replaced by F, Cl, Br, or I. Examples of the haloalkyl group may be a fluoroalkyl group, for example a perfluoroalkyl group.

As used herein, when a definition is not otherwise provided, "a cyano-containing group" refers to a C1 to C30 alkyl group, a C2 to C30 alkenyl group, or a C2 to C30 alkynyl group where at least one hydrogen is replaced by a cyano group. Examples of the cyano-containing group may be =(CR$^x$R$^y$)$_p$C(CN)$_2$, wherein R$^x$ and R$^y$ are each independently hydrogen or a C1 to C10 alkyl group and p is an integer of 0 to 10. For example, the cyano-containing group may be a dicyanomethyl group, a dicyanomethenyl group, or a cyanomethynyl group.

As used herein, when specific definition is not otherwise provided, the term "hetero" refers to one including 1 to 3 heteroatoms selected from N, O, S, and P.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the drawings, parts having no relationship with the description are omitted for clarity of the example embodiments, and the same or similar constituent elements are indicated by the same reference numerals throughout the specification.

In order to more specifically describe example embodiments, various features will be described in detail with reference to the attached drawings. However, example embodiments described are not limited thereto.

Example embodiments relate to organic photoelectric devices, image sensors, and/or electronic devices.

Hereinafter, an organic photoelectric device according to example embodiments is described with reference to drawings.

FIG. 1 is a cross-sectional view of an organic photoelectric device according to example embodiments.

Referring to FIG. 1, an organic photoelectric device 100 according to example embodiments includes a first electrode 10 and a second electrode 20, and an active layer 30 interposed between the first electrode 10 and the second electrode 20.

One of the first electrode 10 and the second electrode 20 is an anode and the other is a cathode. At least one of the first electrode 10 and the second electrode 20 may be a light-transmitting electrode, and the light-transmitting electrode may be made of, for example, a transparent conductor such as indium tin oxide (ITO) or indium zinc oxide (IZO), or a metal thin layer of a monolayer or multilayer. When one of the first electrode 10 and the second electrode 20 is a non-light-transmitting electrode, it may be made of, for example, an opaque conductor such as aluminum (Al).

For example, the first electrode 10 and the second electrode 20 may both be light-transmitting electrodes.

The active layer 30 includes a p-type semiconductor and an n-type semiconductor to form a pn junction, and absorbs external light to generate excitons and then separates the generated excitons into holes and electrons.

The active layer 30 includes a p-type semiconductor compound including a squaraine derivative and an n-type semiconductor compound represented by Chemical Formula 1.

[Chemical Formula 1]

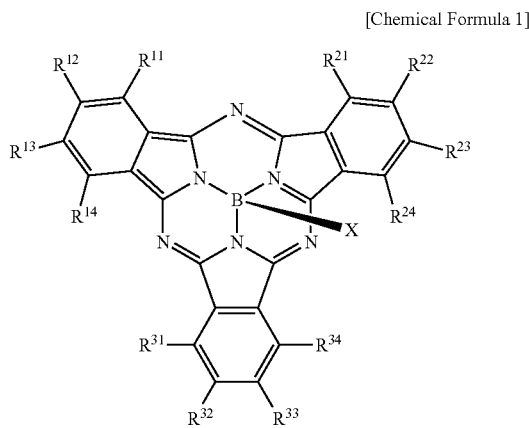

[Chemical Formula 2]

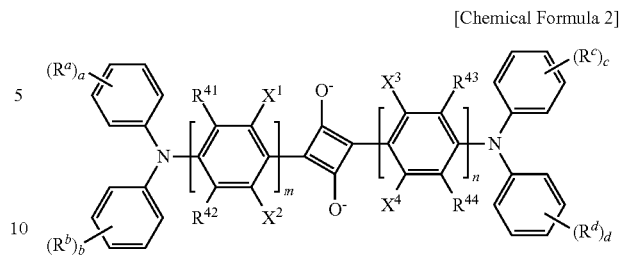

In Chemical Formula 1

$R^{11}$ to $R^{14}$, $R^{21}$ to $R^{24}$, and $R^{31}$ to $R^{34}$ are each independently hydrogen, a substituted or unsubstituted C1 to C30 alkyl group, a substituted or unsubstituted C6 to C30 aryl group, a substituted or unsubstituted C3 to C30 heteroaryl group, a nitro group, a cyano group, a cyano-containing group, $SF_5$, a halogen, for example F, Cl, or Br, or a halogen-containing group, for example $CF_3$, provided that at least one of $R^{11}$ to $R^{14}$, at least one of $R^{21}$ to $R^{24}$, and at least one of $R^{31}$ to $R^{34}$ are a nitro group, a cyano group, a cyano-containing group, $SF_5$, a halogen, a halogen-containing group, or a combination thereof, and X is a halogen, OAr (wherein Ar is a substituted or unsubstituted C6 to C30 aryl group or a substituted or unsubstituted C5 to C20 heteroaryl group), OR (wherein R is a substituted or unsubstituted linear or branched C1 to C30 alkyl group), or $OSiR^1R^2R^3$ (wherein $R^1$, $R^2$, and $R^3$ are each independently a substituted or unsubstituted linear or branched C1 to C30 alkyl group).

In Chemical Formula 1, $R^{12}$, $R^{13}$, $R^{22}$, $R^{23}$, $R^{32}$, and $R^{33}$ are each independently an electron withdrawing group selected from a nitro group, a cyano group, a cyano-containing group, $SF_5$, a halogen, a halogen-containing group, or a combination thereof, and $R^{11}$, $R^{14}$, $R^{21}$, $R^{24}$, $R^{31}$, and $R^{33}$ are independently hydrogen, a C1 to C30 alkyl group, a C6 to C30 aryl group, a C3 to C30 heteroaryl group, or a combination thereof, for example hydrogen, a C1 to C15 alkyl group, a C6 to C18 aryl group, a C3 to C12 heteroaryl group, or a combination thereof. In this way, the electron withdrawing groups are disposed to face each other with respect to nitrogen (N) bonded with boron (B) in the center of Chemical Formula 1, and thus may increase interaction with the nitrogen (N).

In Chemical Formula 1, when the electron withdrawing group such as a nitro group, a cyano group, a cyano-containing group, $SF_5$, a halogen, a halogen-containing group, or a combination thereof is present at the at least one of $R^{11}$ to $R^{14}$, at least one of $R^{21}$ to $R^{24}$, and at least one of $R^{31}$ to $R^{34}$, light in a green wavelength region ranging from about 500 nm to about 600 nm may be effectively absorbed.

The squaraine derivative may be represented by Chemical Formula 2.

In Chemical Formula 2, $R^{41}$ to $R^{44}$ are each independently hydrogen, a substituted or unsubstituted C1 to C20 alkyl group, a substituted or unsubstituted C6 to C12 aryl group, or a substituted or unsubstituted C3 to C20 heteroaryl group, $X^1$ to $X^4$ are each independently hydrogen, a hydroxy group, a substituted or unsubstituted C1 to C20 alkyl group, a substituted or unsubstituted C6 to C12 aryl group, or a substituted or unsubstituted C3 to C20 heteroaryl group, provided that at least one of $X^1$ and $X^2$ and at least one of $X^3$ and $X^4$ are a hydroxy group, $R^a$ to $R^d$ are each independently hydrogen, a substituted or unsubstituted C1 to C20 alkyl group, a substituted or unsubstituted C6 to C12 aryl group, or a substituted or unsubstituted C3 to C20 heteroaryl group, a to d are each independently an integer of 0 to 5, and m and n are independently an integer of 0 or 1, but are not simultaneously 0 or 1.

In Chemical Formula 2, when one of the m and the n is 0, while the other is 1, compared with when both the m and the n are 0 or 1, absorbance at a wavelength ranging from about 500 nm to about 600 nm is improved. When one of the m and the n is 0 while the other is 1, the $X^1$ and $X^2$ or the $X^3$ and $X^4$ may be a hydroxy group.

The p-type semiconductor compound and the n-type semiconductor compound selectively absorb light in a set (or predetermined) wavelength region of a visible ray region, respectively. For example, the p-type semiconductor compound and the n-type semiconductor compound may selectively absorb light in a green wavelength region and may have a maximum absorption wavelength ($\lambda_{max}$) at about 500 nm to about 600 nm.

Wavelength selectivity for absorbing light in a set (or predetermined) wavelength region of a visible ray region may be indicated by a full width at half maximum (FWHM). Herein, the FWHM is a width of a wavelength corresponding to a half of a maximum absorption point. As used herein, when specific definition is not otherwise provided, it may be defined by absorbance measured by UV-Vis spectroscopy. A smaller FWHM indicates selective absorption of light in a narrow wavelength region and high wavelength selectivity.

The active layer 30 may show a light absorption curve having a relatively narrow FWHM in a thin film state of about 50 nm to about 100 nm. The active layer 30 may be a thin film formed by vacuum deposition.

As described above, the p-type semiconductor compound and the n-type semiconductor compound show improved wavelength selectivity in a range of about 500 nm to about 600 nm, and thus have low crosstalk among absorption wavelengths, and resultantly may improve color reproducibility of a device.

The p-type semiconductor material and the n-type semiconductor material may have an energy bandgap of about 1.0 eV to about 3.0 eV. When the p-type semiconductor compound and the n-type semiconductor compound of the active layer 30 respectively have an energy bandgap within the ranges, the active layer 30 may selectively absorb light in a green wavelength region, and specifically, show a maximum absorption peak in a wavelength region ranging from about 500 nm to about 600 nm.

The p-type semiconductor material and the n-type semiconductor material may have a LUMO energy level difference of about 1.0 eV to about 3.0 eV. When the p-type semiconductor material and the n-type semiconductor material in the active layer 130 have a lowest unoccupied molecular orbital (LUMO) energy level difference within the range, external quantum efficiency (EQE) may be improved and effectively adjusted depending on a bias applied thereto.

The p-type semiconductor compound and the n-type semiconductor compound may be uniformly present in an active layer 30.

In addition, the active layer 30 may include the p-type semiconductor compound and the n-type semiconductor compound in various ratios depending on its location. For example, when the first electrode is an anode and the second electrode is a cathode, the active layer may include a greater amount of the p-type semiconductor compound moving closer to the anode, and may include a greater amount of the n-type semiconductor compound moving closer to the cathode. Herein, a volume ratio between the p-type semiconductor compound and the n-type semiconductor compound may keep changing in a thickness direction continuously or in a stepwise form.

The active layer 30 may be a single layer or a multilayer. The active layer 30 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor compound and the n-type semiconductor compound in a thickness ratio of about 1:100 to about 100:1. The compounds may be included in a thickness ratio ranging from about 1:50 to about 50:1 within the range, for example, about 1:10 to about 10:1, for another example, about 1:1. When the compounds have the ratio within the range, an exciton may be effectively produced and a pn junction may be effectively formed.

The p-type layer may include the p-type semiconductor compound and the n-type layer may include the n-type semiconductor compound.

The active layer 30 may have a thickness of about 1 nm to about 500 nm, for example, about 5 nm to about 300 nm. When the active layer 30 has a thickness within the range, the active layer may effectively absorb light, effectively separate holes from electrons, and deliver them, thereby effectively improving photoelectronic conversion efficiency.

In the organic photoelectric device 100, when light enters from the first electrode 10 and/or second electrode 20, and when the active layer 30 absorbs light having a set (or predetermined) wavelength region, excitons may be produced from the inside. The excitons are separated into holes and electrons in the active layer 30, and the separated holes are transported to an anode that is one of the first electrode 10 and second electrode 20 and the separated electrons are transported to the cathode that is the other of and the first electrode 10 and second electrode 20 so as to flow a current in the organic photoelectric device.

Hereinafter, an organic photoelectric device according to example embodiments is described with reference to FIG. 2.

Figure 2:
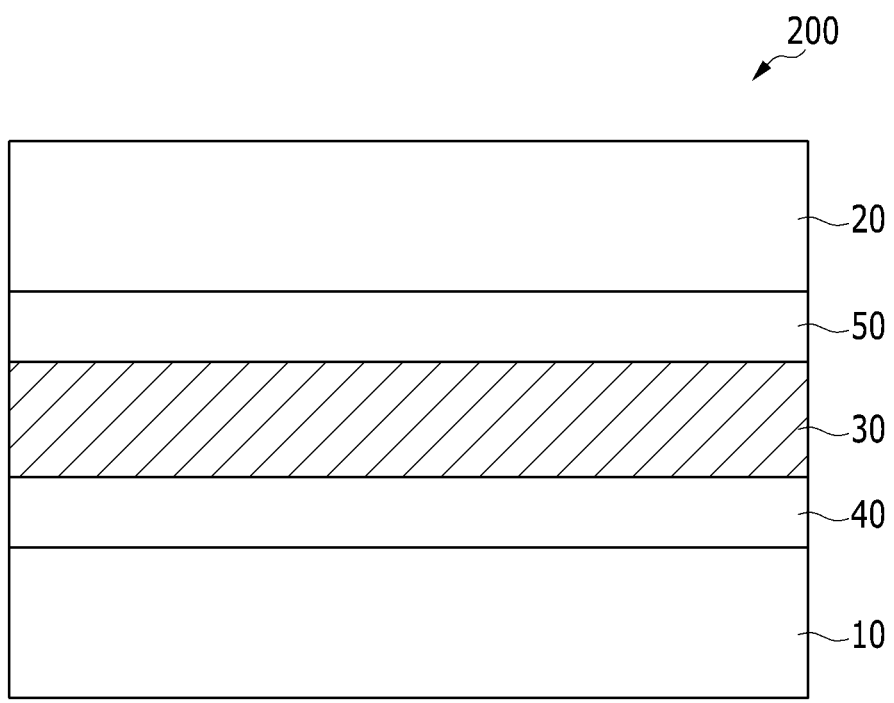

FIG. 2 is a cross-sectional view showing an organic photoelectric device according to example embodiments.

Referring to FIG. 2, an organic photoelectric device 200 according to the present example embodiments includes a first electrode 10 and a second electrode 20 facing each other, and an active layer 30 interposed therebetween, like the above example embodiments.

However, the organic photoelectric device 200 according to the present example embodiments further includes charge auxiliary layers 40 and 50 between the first electrode 10 and the active layer 30, and the second electrode 20 and the active layer 30, unlike the above example embodiments. The charge auxiliary layers 40 and 50 may facilitate the transfer of holes and electrons separated from the active layer 30, so as to increase efficiency.

The charge auxiliary layers 40 and 50 may be at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide such as molybdenum oxide, tungsten oxide, or nickel oxide.

The hole transport layer (HTL) may include one selected from, for example, poly(3,4-ethylenedioxythiophene):poly (styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N, N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 50 may be omitted.

The organic photoelectric device may be applied to various fields, for example a solar cell, an image sensor, a photo-detector, a photo-sensor, and an organic light emitting diode (OLED), but is not limited thereto.

Hereinafter, an example of an image sensor including the organic photoelectric device is described referring to drawings. As an example of an image sensor, an organic CMOS image sensor is described.

Figure 3:
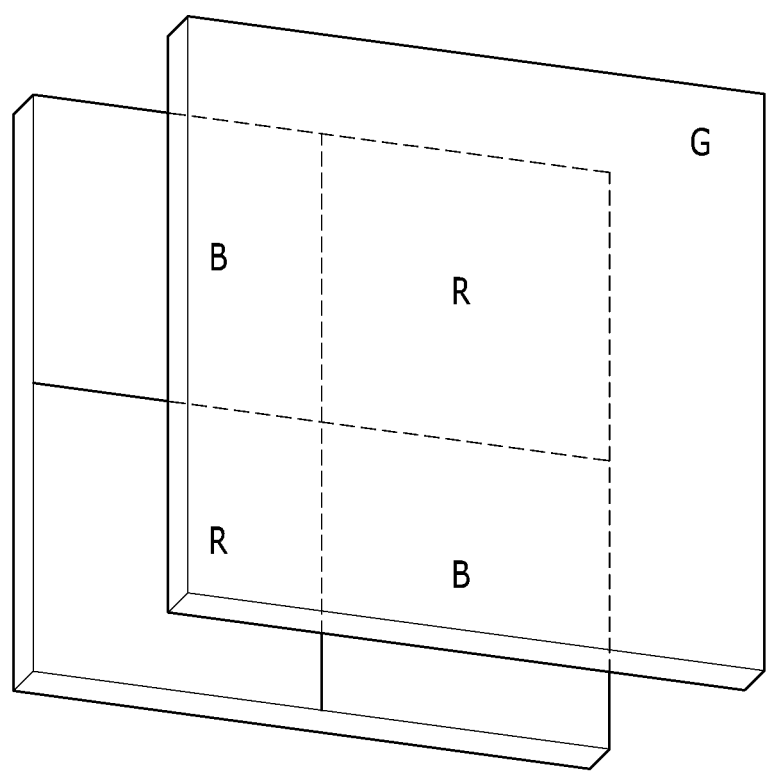
Figure 4:
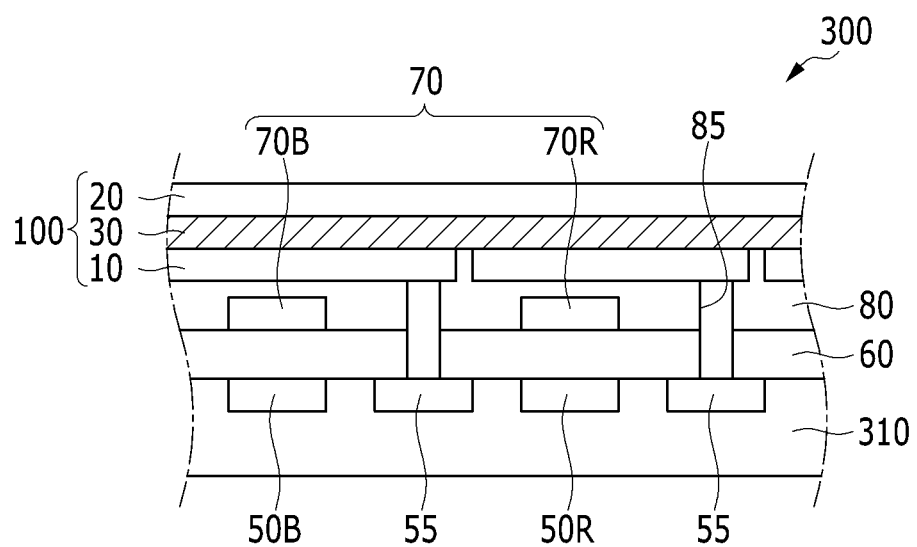

FIG. 3 is a schematic top plan view of an organic CMOS image sensor according to example embodiments, and FIG. 4 is a cross-sectional view of the organic CMOS image sensor of FIG. 3.

Referring to FIGS. 3 and 4, an organic CMOS image sensor 300 according to example embodiments includes a semiconductor substrate 310 integrated with photo-sensing devices 50B and 50R, a transmission transistor (not shown), a charge storage 55, a lower insulation layer 60, a color filter layer 70, an upper insulation layer 80, and an organic photoelectric device 100.

The semiconductor substrate 310 may be a silicon substrate, and is integrated with the photo-sensing devices 50B and 50R, the transmission transistor (not shown), and the charge storage 55. The photo-sensing devices 50B and 50R may be photodiodes.

The photo-sensing devices 50B and 50R, the transmission transistor, and/or the charge storage 55 may be integrated in each pixel, and as shown in the drawing, the photo-sensing devices 50B and 50R may be respectively included in a blue pixel and a red pixel and the charge storage 55 may be included in a green pixel.

The photo-sensing devices 50B and 50R sense light, the information sensed by the photo-sensing devices may be transferred by the transmission transistor, the charge storage 55 is electrically connected with the organic photoelectric device 100, and the information of the charge storage 55 may be transferred by the transmission transistor.

In the drawings, the photo-sensing devices 50B and 50R are, for example, arranged in parallel without limitation, and the blue photo-sensing device 50B and the red photo-sensing device 50R may be stacked in a vertical direction.

A metal wire (not shown) and a pad (not shown) are formed on the semiconductor substrate 310. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the photo-sensing devices 50B and 50R.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70B formed in the blue pixel and a red filter 70R filled in the red pixel. In the present example embodiments, a green filter is not included, but a green filter may be further included.

The color filter layer 70 may be omitted. For example, when the blue photo-sensing device 50B and the red photo-sensing device 50R are stacked in a vertical direction, the blue photo-sensing device 50B and the red photo-sensing device 50R may selectively absorb light in each wavelength region depending on their stack depth, and the color filter layer 70 may not be equipped.

The upper insulation layer 80 is formed on the color filter layer 70. The upper insulation layer 80 eliminates a step caused by the color filter layer 70 and smoothens the surface. The upper insulation layer 80 and the lower insulation layer 60 may include a contact hole (not shown) exposing a pad, and a through-hole 85 exposing the charge storage 55 of the green pixel.

The organic photoelectric device 100 is formed on the upper insulation layer 80. The organic photoelectric device 100 includes the first electrode 10, the active layer 30, and the second electrode 20 as described above.

The first electrode 10 and the second electrode 20 may be transparent electrodes, and the active layer 30 is the same as described above. The active layer 30 selectively absorbs light in a green wavelength region and replaces a color filter of a green pixel.

When light enters from the second electrode 20, the light in a green wavelength region may be mainly absorbed in the active layer 30 and photoelectrically converted, while the light in the rest of the wavelength region passes through first electrode 10 and may be sensed in the photo-sensing devices 50B and 50R.

An organic photoelectric device including the active layer 30 shows improved selective absorbance regarding light in the green wavelength region, and thus may be usefully applied to an image sensor having a stacking structure shown in FIGS. 3 and 4. As described above, the organic photoelectric device selectively absorbing light in a green wavelength region is stacked, and thereby a size of an image sensor may be decreased and a down-sized image sensor may be realized.

Figure 5:
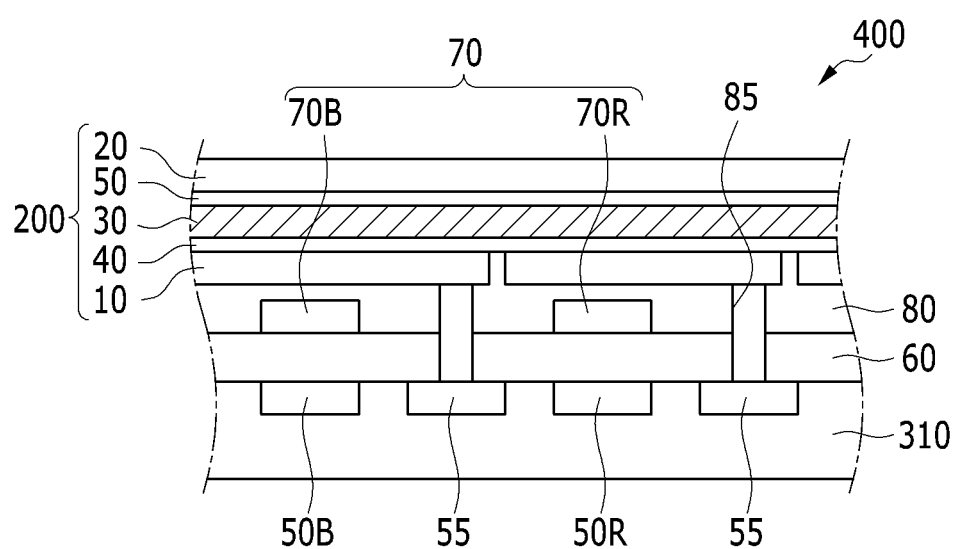

In FIG. 4, the organic photoelectric device 100 of FIG. 1 is included, but it is not limited thereto, and thus the organic photoelectric device 200 of FIG. 2 may be applied in the same manner. FIG. 5 shows a structure of an image sensor having such a structure, and is a cross-sectional view of an organic CMOS image sensor 400 including the organic photoelectric device 200 in FIG. 2.

Figure 6:
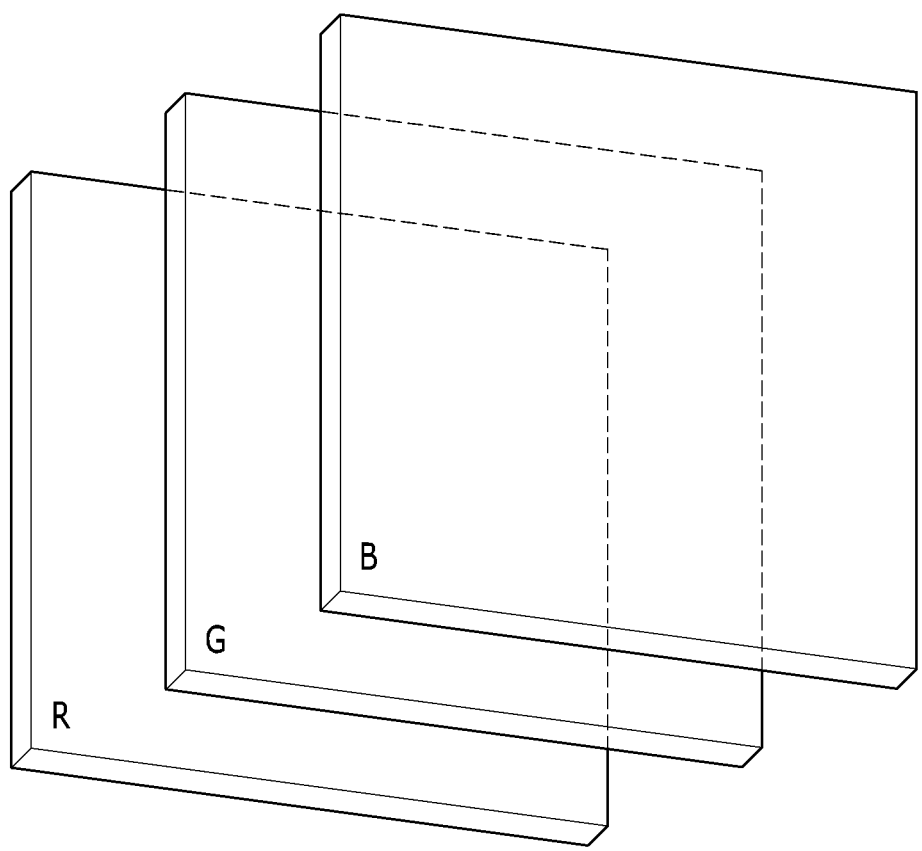
Figure 7:
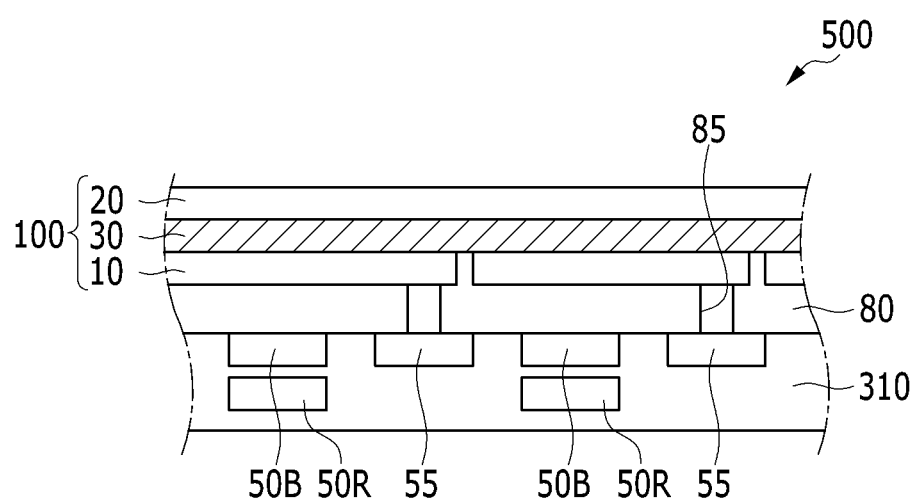

FIG. 6 is a schematic top plan view showing an organic CMOS image sensor according to example embodiments, and FIG. 7 is a cross-sectional view showing the organic CMOS image sensor of FIG. 6.

Referring to FIGS. 6 and 7, the organic CMOS image sensor 500 according to the present example embodiments includes a green photoelectric device selectively absorbing light in a green wavelength region, a blue photoelectric device selectively absorbing light in a blue wavelength region, and a red photoelectric device selectively absorbing light in a red wavelength region that are stacked.

The organic CMOS image sensor 500 according to the present example embodiments includes a semiconductor substrate 310 integrated with photo-sensing devices 50B and 50R, a transmission transistor (not shown), a charge storage 55, an insulation layer 80, and an organic photoelectric device 100, like the above example embodiments.

However, the organic CMOS image sensor 500 according to the present example embodiments includes the blue photo-sensing device 50B and the red photo-sensing device 50R that are stacked and does not include a color filter layer 70, unlike the above example embodiments. The blue photo-sensing device 50B and the red photo-sensing device 50R are electrically connected with the charge storage (not shown), and the information of the charge storage 55 may be transferred by the transmission transistor. The blue photo-sensing device 50B and the red photo-sensing device 50R may selectively absorb light in each wavelength region depending on a stack depth.

An organic photoelectric device including the compound for an organic optoelectronic device shows improved selective absorption regarding light in a green wavelength region, and thus may be applied to an image sensor having a stacking structure shown in FIGS. 6 and 7. Because the organic photoelectric device selectively absorbing light in the green wavelength region has a stacked structure, and the red photo-sensing device and the blue photo-sensing device also have a stacked structure, an image sensor may be much further down-sized.

In addition, as described above, the organic photoelectric device 100 may increase green wavelength selectivity and decrease crosstalk generated by unnecessarily absorbing light in a wavelength region other than the green wavelength region, and thus increase sensitivity.

In the drawing, the red photoelectric device, the green photoelectric device, and the blue photoelectric device are sequentially stacked, but the stack order may be changed without limitation.

The green photoelectric device may be the above organic photoelectric device 100, the blue photoelectric device may include electrodes facing each other and an active layer interposed therebetween and including an organic material selectively absorbing light in a blue wavelength region, and the red photoelectric device may include electrodes facing each other and an active layer interposed therebetween and including an organic material selectively absorbing light in a red wavelength region.

As described above, the organic photoelectric device selectively absorbing light in a green wavelength region, the organic photoelectric device selectively absorbing light in a red wavelength region, and the organic photoelectric device selectively absorbing light in a blue wavelength region are stacked, and thereby a size of an image sensor may be decreased and a down-sized image sensor may be realized.

In FIG. 7, the organic photoelectric device 100 of FIG. 1 is included, but it is not limited thereto, and thus the organic photoelectric device 200 of FIG. 2 may be applied in the same manner.

The image sensor may be applied to various electronic devices, for example a mobile phone, a digital camera, and the like, but is not limited thereto.

Hereinafter, the present disclosure is illustrated in more detail with reference to examples. However, the present disclosure is not limited thereto.

SYNTHESIS EXAMPLES

Preparation of n-Type Semiconductor Compound

Synthesis Example 1

4,5-dichlorophthalonitrile (25 g, 127.6 mmol) and anhydrous dichlorobenzene (255 mL) as a solvent are put in a 1.0 L three-necked flask equipped with a condenser, a drip funnel, a septum, and a magnetic bar and substituted with nitrogen, and 1.2 equivalents of boron trichloride (in a heptane solution) based on 1 equivalent of the 4,5-dichlorophthalonitrile is added thereto. The mixed solution is refluxed for 5 hours and cooled down to room temperature (25° C.) and then nitrogen-bubbled for 90 minutes. Then, hexane is added thereto, the mixture is filtered, and a solvent is removed therefrom, obtaining a purple solid. The solid is purified through column chromatography (silica gel, dichloromethane), obtaining a compound represented by Chemical Formula 1a (10.3 g, 16.2 mmol). The yield is 39%.

$^1$H-NMR (300 MHz, CDCl3): δ 8.95 (s, 1H)

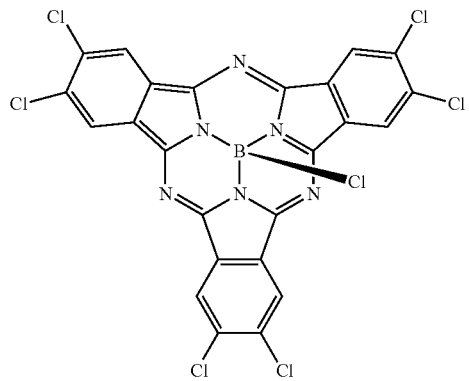

[Chemical Formula 1a]

Synthesis Example 2

4,5-difluorophthalonitrile (10 g, 61.0 mmol) and dichlorobenzene (120 mL) as a solvent are prepared in a 1.0 L three-necked flask equipped with a condenser, a drip funnel, a septum, and a magnetic bar and substituted with nitrogen, and 2 equivalents of boron trichloride (in a heptane solution) based on 1 equivalent of the 4,5-difluorophthalonitrile is added thereto. The mixed solution is refluxed for 5 hours and cooled down to room temperature (25° C.) and then nitrogen-bubbled for 90 minutes. Then, hexane is added to the obtained reaction solution, the mixture is filtered, and a solvent in the filtered solution is removed, obtaining a strong purple solid. The obtained solid is purified through column chromatography (silica gel, dichloromethane), obtaining a compound represented by Chemical Formula 1b (6.91 g, 12.8 mmol). The yield is 64%.

$^1$H-NMR (300 MHz, CDCl3): δ 8.95 (s, 1H)

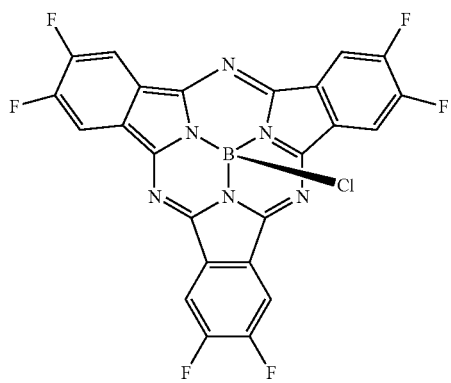

[Chemical Formula 1b]

Synthesis Example 3

4,5-dibromophthalonitrile (20 g, 69.9 mmol) and anhydrous dichlorobenzene (140 mL) as a solvent are prepared in a 1.0 L three-necked flask equipped with a condenser, a drip funnel, a septum, and a magnetic bar and substituted with nitrogen, and 2.3 equivalents of boron trichloride (in a heptane solution) is added thereto based on 1 equivalent of the 4,5-dibromophthalonitrile. The mixed solution is refluxed for 5 hours and cooled down to room temperature (25° C.) and then nitrogen-bubbled for 90 minutes. Then, hexane is added to the reaction solution, the mixture is filtered, and then a solvent in the filtered solution is removed, obtaining a purple solid. The solid is purified through column chromatography (silica gel, dichloromethane), obtaining a compound represented by Chemical Formula 1c (6.91 g, 12.8 mmol). The yield is 64%.

$^1$H-NMR (300 MHz, bromobenzene-d5): d 8.95 (s, 1H)

[Chemical Formula 1c]

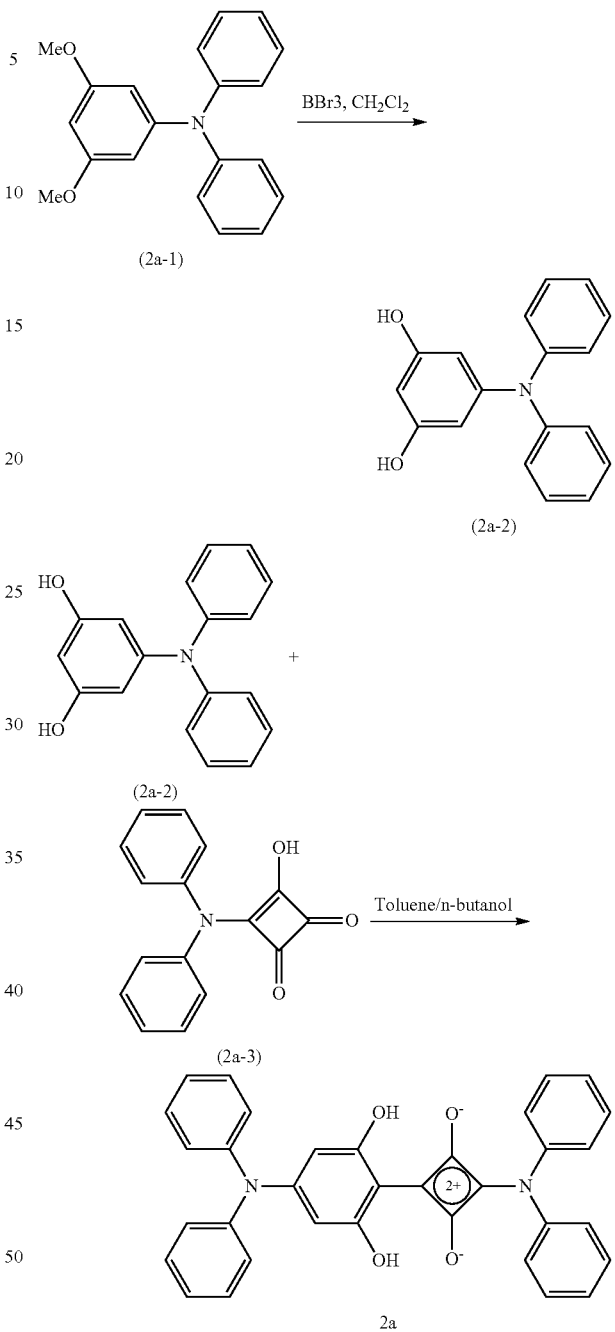

Synthesis Example 4

First, 3,5-dimethoxy-N,N'-diphenylaniline (a compound 2a-1) is dissolved in dichloromethane, 1 M BBr$_3$ (in dichloromethane) is added thereto, the mixture is reacted for 2 hours and then for 30 minutes more by pouring ice water thereinto to complete the hydrolysis reaction, and the resultant is extracted with dichloromethane. The obtained product is purified through column chromatography, obtaining 3,5-(dihydroxyphenyl)-N,N-diphenylamine (a compound 2a-2). The obtained 3,5-(dihydroxyphenyl)-N,N-diphenylamine (the compound 2a-2) (1.02 g, 4.0 mmol) and diphenylaminosquarate (the compound 2a-3) (1 g, 3.8 mmol) are dissolved in 90 ml of toluene/30 ml of n-butanol, the solution is reacted under a nitrogen stream for one night, and purified through column chromatography and then dried, obtaining red solid DPASQ represented by Chemical Formula 2a.

[Chemical Formula 2a]

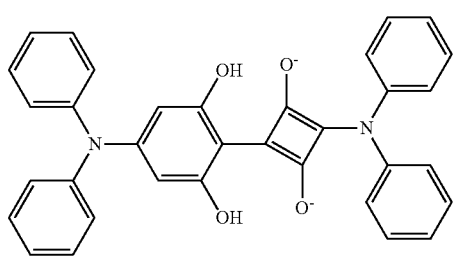

Manufacture of Organic Photoelectric Device

Example 1

An about 100 nm-thick anode is formed by sputtering ITO on a glass substrate, and a 20 nm-thick molybdenum oxide (MoO$_x$, 0<x≤3) thin film is laminated as a charge auxiliary layer thereon. Subsequently, an 70 nm-thick active layer is formed by co-depositing the compound of Chemical Formula 1a according to Synthesis Example 1 (an n-type semiconductor compound) and the compound of Chemical Formula 2a according to Synthesis Example 4 (a p-type semiconductor compound) in a thickness ratio of 1:1 on the molybdenum oxide ($MoO_x$) thin film. An 80 nm-thick cathode is formed on the active layer by sputtering aluminum (Al), manufacturing an organic photoelectric device.

Example 2

An organic photoelectric device is manufactured according to the same method as Example 1, except for using the compound of Chemical Formula 1 b according to Synthesis Example 2 instead of the compound of Chemical Formula 1a according to Synthesis Example 1.

Example 3

An organic photoelectric device is manufactured according to the same method as Example 1, except for using the compound of Chemical Formula 1c according to Synthesis Example 2 instead of the compound of Chemical Formula 1a according to Synthesis Example 1.

Comparative Example 1

An organic photoelectric device is manufactured according to the same method as Example 1, except for using C60 instead of the compound of Chemical Formula 1a according to Synthesis Example 1.

External quantum efficiency (EQE) of the organic photoelectric devices according to Examples 1 to 3 and Comparative Example 1 is evaluated depending on a wavelength. The external quantum efficiency is measured by using an IPCE measurement apparatus (McScience Co., Ltd.). First, the external quantum efficiency is calibrated by using a Si photodiode (Hamamatsu Photonics K.K., Japan), and then each organic photoelectric device according to Examples 1 to 3 and Comparative Example 1 is mounted thereon, and their external quantum efficiency is measured in a wavelength region of about 350 nm to 800 nm.

The external quantum efficiency (EQE) measured by the IPCE measuring apparatus indicates the amount of charges formed by the amount of externally incident light, and internal quantum efficiency (IQE) is obtained as the amount of converted charges relative to the amount of light absorbed in an active layer of the device by measuring a ratio of the amount of light absorbed in an absorption layer based on the amount of the entire incident light with UV-vis and multiplying the ratio by the EQE after removing reflected or transmitted light, when the incident light of the device is reflected or transmitted without being absorbed before being absorbed in the absorption layer. In addition, absorbance of the device depending on incident light is measured by using a spectrometer, and then a wavelength showing maximum absorbance is measured as $\lambda_{max}$. The external quantum efficiency (EQE), internal quantum efficiency (IQE), absorption efficiency ($\eta_A$), and $\lambda_{max}$ of the organic photoelectric devices according to Examples 1 and 2 and Comparative Example 1 at 3 V are provided in the following Table 1.

TABLE 1

| | EQE at 3 V | IQE at 3 V | $\eta_A$ at 3 V | $\lambda_{max}$ (nm) | EQE at $\lambda_{max}$ ($EQE_{max}$) | $EQE_{430\,nm}$ | $EQE_{max}/EQE_{430\,nm}$ |
|---|---|---|---|---|---|---|---|
| Example 1 | 52% | 62% | 84% | 550-570 | 52% | 8% | 6.5 |
| Example 2 | 33% | 38% | 86% | 550 | 33% | 5.7% | 6.0 |
| Comparative Example 1 | 70% | 78% | 90% | 550 | 56% | 31% | 1.8 |

In Table 1, the organic photoelectric devices according to Examples 1 and 2 show excellent light absorption characteristics in a green absorption wavelength region (about 500 nm to about 600 nm) compared with the organic photoelectric device according to Comparative Example 1. In addition, much higher $EQE_{max}$ in the green wavelength region than EQEmax in the blue wavelength region shows almost no generation of crosstalk between the blue absorption wavelength and the green absorption wavelength.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

<Description of Symbols>

10: first electrode  20: second electrode
30: active layer
100, 200: organic photoelectric device
300: organic CMOS image sensor

What is claimed is:

1. An organic photoelectric device, comprising:
a first electrode and a second electrode facing each other; and
an active layer between the first electrode and the second electrode,
wherein the active layer includes a p-type semiconductor compound including a squaraine derivative and an n-type semiconductor compound represented by Chemical Formula 1:

[Chemical Formula 1]

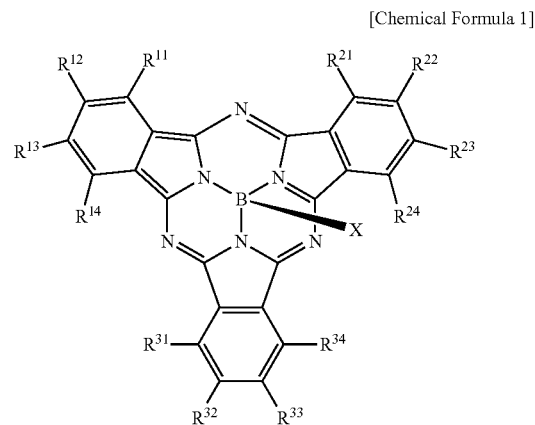

wherein, in Chemical Formula 1,
$R^{11}$ to $R^{14}$, $R^{21}$ to $R^{24}$, and $R^{31}$ to $R^{34}$ are each independently hydrogen, a substituted or unsubstituted C1 to C30 alkyl group, a substituted or unsubstituted C6 to C30 aryl group, a substituted or unsubstituted C3 to C30 heteroaryl group, a nitro group, a cyano group, a cyano-containing group, $SF_5$, a halogen, or a halogen-containing group, provided that at least one of $R^{11}$ to $R^{14}$, at least one of $R^{21}$ to $R^{24}$, and at least one of $R^{31}$ to $R^{34}$ are a nitro group, a cyano group, a cyano-containing group, $SF_5$, a halogen, a halogen-containing group, or a combination thereof, and X is a halogen, OAr (wherein Ar is a substituted or unsubstituted C6 to C30 aryl group or a substituted or unsubstituted C5 to C20 heteroaryl group), OR (wherein R is a substituted or unsubstituted linear or branched C1 to C30 alkyl group), or $OSiR^1R^2R^3$ (wherein $R^1$, $R^2$, and $R^3$ are each independently a substituted or unsubstituted linear or branched C1 to C30 alkyl group).

2. The organic photoelectric device of claim 1, wherein, in Chemical Formula 1,
$R^{12}, R^{13}, R^{22}, R^{23}, R^{32}$, and $R^{33}$ are each independently a nitro group, a cyano group, a cyano-containing group, $SF_5$, a halogen, a halogen-containing group, or a combination thereof, and
$R^{11}, R^{14}, R^{21}, R^{24}, R^{31}$, and $R^{33}$ are independently hydrogen, a C1 to C30 alkyl group, a C6 to C30 aryl group, a C3 to C30 heteroaryl group, or a combination thereof.

3. The organic photoelectric device of claim 1, wherein the squaraine derivative is represented by Chemical Formula 2:

[Chemical Formula 2]

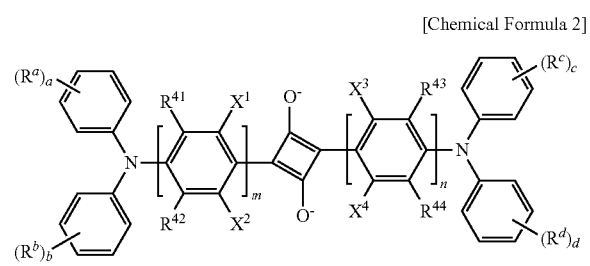

wherein, in Chemical Formula 2,
$R^{41}$ to $R^{44}$ are each independently hydrogen, a substituted or unsubstituted C1 to C20 alkyl group, a substituted or unsubstituted C6 to C12 aryl group, or a substituted or unsubstituted C3 to C20 heteroaryl group,
$X^1$ to $X^4$ are each independently hydrogen, a hydroxy group, a substituted or unsubstituted C1 to C20 alkyl group, a substituted or unsubstituted C6 to C12 aryl group, or a substituted or unsubstituted C3 to C20 heteroaryl group, provided that at least one of $X^1$ and $X^2$ and at least one of $X^3$ and $X^4$ are a hydroxy group,
$R^a$ to $R^d$ are each independently hydrogen, a substituted or unsubstituted C1 to C20 alkyl group, a substituted or unsubstituted C6 to C12 aryl group, or a substituted or unsubstituted C3 to C20 heteroaryl group,
a to d are each independently an integer of 0 to 5, and
m and n are independently an integer of 0 or 1, but are not simultaneously 0 or 1.

4. The organic photoelectric device of claim 3, wherein the active layer shows a maximum absorption peak in a wavelength region of about 500 nm to about 600 nm.

5. The organic photoelectric device of claim 1, wherein the active layer shows a light absorption curve depending on a wavelength having a full width at half maximum (FWHM) in a thin film state of about 50 nm to about 100 nm.

6. The organic photoelectric device of claim 1, wherein the p-type semiconductor compound and n-type semiconductor compound each have an energy bandgap of about 1.0 eV to about 3.0 eV.

7. The organic photoelectric device of claim 1, wherein an lowest unoccupied molecular orbital (LUMO) difference between the p-type semiconductor compound and n-type semiconductor compound is about 1.0 eV to about 3.0 eV.

8. The organic photoelectric device of claim 1, wherein the active layer includes the p-type semiconductor compound and the n-type semiconductor compound, and
a volume ratio of the p-type semiconductor compound to the n-type semiconductor compound varies based on locations of the p-type and n-type semiconductor compounds.

9. The organic photoelectric device of claim 8, wherein the first electrode is an anode and the second electrode is a cathode,
an amount of the p-type semiconductor compound increases from the cathode towards the anode, and
an amount of the n-type semiconductor compound increases from the anode towards the cathode.

10. The organic photoelectric device of claim 1, wherein the p-type semiconductor compound and the n-type semiconductor compound are included in a volume ratio of about 1:100 to about 100:1.

11. The organic photoelectric device of claim 1, further comprising:
a p-type layer between the first electrode and the active layer,
wherein the p-type layer includes the p-type semiconductor compound.

12. The organic photoelectric device of claim 1, further comprising:
an n-type layer between the second electrode and the active layer,
wherein the n-type layer includes the n-type semiconductor compound.

13. An image sensor, comprising:
the organic photoelectric device according to claim 1.

14. The image sensor of claim 13, further comprising:
a semiconductor substrate integrated with a plurality of first photo-sensing devices sensing light in a blue wavelength region and a plurality of second photo-sensing devices sensing light in a red wavelength region,
wherein the organic photoelectric device is on the semiconductor substrate and selectively absorbs light in a green wavelength region.

15. The image sensor of claim 14, further comprising:
a color filter layer between the semiconductor substrate and the organic photoelectric device,
wherein the color filter includes a blue filter selectively absorbing light in a blue wavelength region and a red filter selectively absorbing light in a red wavelength region.

16. The image sensor of claim 14, wherein the first photo-sensing device and the second photo-sensing device are stacked in a vertical direction on the semiconductor substrate.

17. The image sensor of claim 13, further comprising:

a stack of photoelectric devices, wherein the stack of photoelectric devices includes a green photoelectric device of the organic photoelectric device, a blue photoelectric device selectively absorbing light in a blue wavelength region, and a red photoelectric device selectively absorbing light in a red wavelength region.

18. An electronic device, comprising:

the image sensor according to claim 13.

* * * * *